US012386107B2

(12) United States Patent
Kuzuhara et al.

(10) Patent No.: US 12,386,107 B2
(45) Date of Patent: Aug. 12, 2025

(54) OPTICAL SYSTEM

(71) Applicant: Panasonic Intellectual Property Management Co., Ltd., Osaka (JP)

(72) Inventors: Satoshi Kuzuhara, Osaka (JP); Tsuneo Uchida, Chiba (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 509 days.

(21) Appl. No.: 17/970,942

(22) Filed: Oct. 21, 2022

(65) Prior Publication Data

US 2023/0047387 A1 Feb. 16, 2023

Related U.S. Application Data

(63) Continuation of application No. PCT/JP2020/047506, filed on Dec. 18, 2020.

(30) Foreign Application Priority Data

Apr. 24, 2020 (JP) ................. 2020-077618

(51) Int. Cl.
  *G02B 5/04* (2006.01)
(52) U.S. Cl.
  CPC ..................... *G02B 5/04* (2013.01)
(58) Field of Classification Search
  CPC ........ G02B 5/04; G02B 5/10; G02B 17/0804; G02B 17/0812; G02B 17/082;
  (Continued)

(56) References Cited

U.S. PATENT DOCUMENTS 2,769,373 A 11/1956 Bouwers
4,247,772 A 1/1981 Lavelle et al.
(Continued)

FOREIGN PATENT DOCUMENTS

GB 354843 8/1931
JP 2000-231060 8/2000
(Continued)

OTHER PUBLICATIONS

International Preliminary Report on Patentability issued Nov. 3, 2022 in International Application No. PCT/JP2020/047506.
(Continued)

*Primary Examiner* — Ricky D Shafer
(74) *Attorney, Agent, or Firm* — Wenderoth, Lind & Ponack, L.L.P.

(57) ABSTRACT

A prism includes a first intermediate imaging position at which a component in a first direction of the light flux is imaged and a second intermediate imaging position at which a component in a second direction orthogonal to the first direction of the light flux is imaged, different from the first intermediate imaging position. At least one of the first intermediate imaging position and the second intermediate imaging position lying within a first range from the second surface between the first surface and the second surface or lying within a second range from the second surface between the second surface and the third surface. The first range has a length less than one-half of an optical path length from the first surface to the second surface, and the second range has a length less than one-half of the optical path length from the second surface to the third surface.

18 Claims, 10 Drawing Sheets

(58) Field of Classification Search
CPC ............ G02B 17/0828; G02B 17/0836; G02B 17/0856; G02B 17/086
USPC ....... 359/365, 366, 727, 730, 833, 834, 837, 359/858, 861
See application file for complete search history.

(56) References Cited

U.S. PATENT DOCUMENTS

| | | | |
|---|---|---|---|
| 4,948,233 A | | 8/1990 | Maruyama |
| 6,134,051 A | * | 10/2000 | Hayakawa ............ G02B 17/086 359/640 |
| 2002/0101666 A1 | * | 8/2002 | Togino ................... G02B 15/04 359/720 |
| 2002/0163742 A1 | | 11/2002 | Togino |
| 2015/0061975 A1 | | 3/2015 | Komatsu et al. |
| 2016/0334637 A1 | | 11/2016 | Saisho et al. |
| 2018/0259777 A1 | * | 9/2018 | Uemura ............. G02B 27/0172 |
| 2021/0364784 A1 | * | 11/2021 | Kuzuhara .......... G02B 17/0816 |
| 2021/0373304 A1 | * | 12/2021 | Kuzuhara .............. G02B 26/10 |
| 2021/0373305 A1 | * | 12/2021 | Kuzuhara .............. G02B 17/04 |

FOREIGN PATENT DOCUMENTS

| | | |
|---|---|---|
| JP | 2015-148664 | 8/2015 |
| WO | 2018/166921 | 9/2018 |
| WO | 2019/188070 | 10/2019 |

OTHER PUBLICATIONS

Extended European Search Report issued Oct. 13, 2023 in corresponding European Patent Application No. 20931807.0.
International Search Report issued on Feb. 9, 2021 in International Application No. PCT/JP2020/047506, with English translation.
Office Action (Notice of Reasons for Refusal) issued May 7, 2024 in Japanese Application No. 2022-516843, with English translation.

* cited by examiner

OPTICAL SYSTEM

CROSS-REFERENCE TO RELATED APPLICATIONS

This is a continuation application of International Application No. PCT/JP2020/047506, with an international filing date of Dec. 18, 2020, which claims priority of Japanese Patent Application No. 2020-77618 filed on Apr. 24, 2020, the content of which is incorporated herein by reference.

BACKGROUND OF THE INVENTION

1. Technical Field

The present disclosure relates to an optical system using a prism.

2. Description of Related Art

In an optical system, reflecting light with a prism is better for miniaturization of the optical system than reflecting it with a mirror. In the case of using a prism, an intermediate image of light may be formed within the interior of the prism. For example, also in a prism of JP 2000-231060 A, there is formed an intermediate image of light travelling inside the prism.

SUMMARY

In cases where scratch or dust within the prism is present at an intermediate imaging point of light entering the prism, part of light may possibly disappear. A reflection surface of the prism has greater influence on light due to manufacturing error than a refraction surface does.

The present disclosure provides an optical system that comprises a prism reducing the influence of scratch inside the prism as well as reducing the influence of manufacturing error.

An optical system of the present disclosure comprises a prism that includes a first surface, a second surface, and a third surface, with a light flux from the first surface being reflected by the second surface to head for the third surface, the prism having a first intermediate imaging position at which a component in a first direction of the light flux incident inside is imaged and a second intermediate imaging position at which a component in a second direction orthogonal to the first direction of the light flux is imaged, different from the first intermediate imaging position, at least one of the first intermediate imaging position and the second intermediate imaging position lying within a first range from the second surface between the first surface and the second surface or lying within a second range from the second surface between the second surface and the third surface, the first range having a length less than one-half of an optical path length from the first surface to the second surface, the second range having a length less than one-half of the optical path length from the second surface to the third surface.

An optical system of the present disclosure comprises a prism that includes a first surface, a second surface, a third surface, and a fourth surface, with a light flux from the first surface being reflected by the second surface to head for the third surface, the light flux from the second surface being reflected by the third surface to head for the fourth surface, the prism having a first intermediate imaging position at which a component in a first direction of the light flux incident inside is imaged, and a second intermediate imaging position at which a component in a second direction orthogonal to the first direction of the light flux is imaged, different from the first intermediate imaging position, one of the first intermediate imaging position and the second intermediate imaging position lying within a first range from the second surface between the first surface and the second surface or lying within a second range from the second surface between the second surface and the third surface, the other of the first intermediate imaging position and the second intermediate imaging position lying within the second range from the third surface between the second surface and the third surface or lying within a third range from the third surface between the third surface and the fourth surface, the first range having a length less than one-half of an optical path length from the first surface to the second surface, the second range having a length less than one-half of the optical path length from the second surface to the third surface, the third range having a length less than one-half of the optical path length from the third surface to the fourth surface.

The optical system in the present disclosure enables provision of an optical system that comprises a prism reducing the influence of scratch inside the prism as well as reducing the influence of manufacturing error.

DETAILED DESCRIPTION

Embodiments will hereinafter be described in detail with proper reference to the drawings. In some cases, however, more detailed description than necessary may be omitted. For example, detailed description of already well-known matters or duplicate description for substantially the same configuration may be omitted. This is to avoid the following description from becoming unnecessarily redundant, to facilitate the understanding of those skilled in the art.

It is to be noted that the inventor(s) provides the accompanying drawings and the following description for those skilled in the art to fully understand the present disclosure, and that it is not intended to limit thereby the subject matter described in the claims.

First Embodiment

Figure 1:
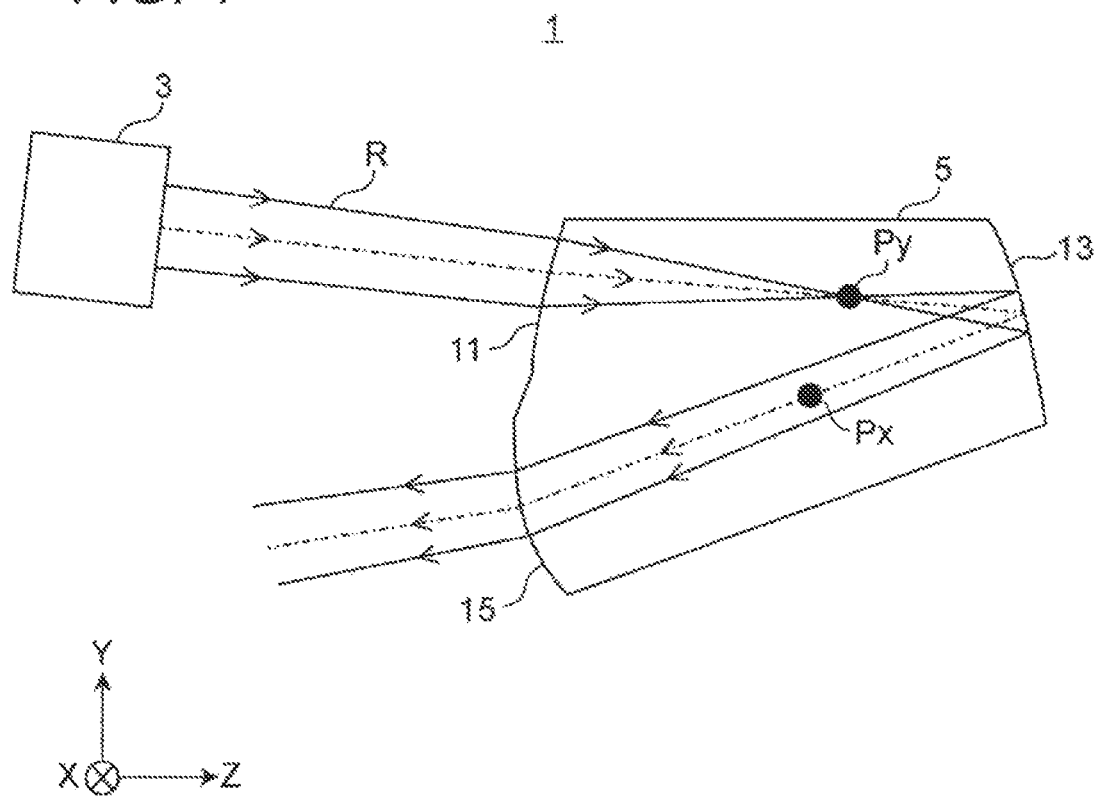
FIG. 1 is a sectional view showing a configuration of an optical system in a first embodiment.
Figure 2:
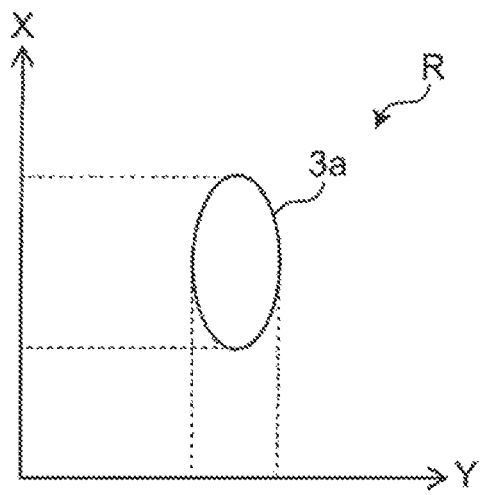
FIG. 2 is a diagram showing a pupil diameter of laser light immediately after irradiation from a laser element in the first embodiment.

Referring to FIGS. 1 to 6, a first embodiment will be described below. In this embodiment, as shown in FIG. 2, for example, X-direction is a major axis direction of a pupil diameter of laser light R emitted from a laser element 3, and Y-direction is a minor axis direction of the pupil diameter of laser light R emitted from the laser element 3. X-direction and Y-direction are orthogonal to each other. An XYZ coordinate system is indicated as coordinates of an optical system. X-direction, Y-direction, and Z-direction are orthogonal to one another.

[1-1. Configuration]

FIG. 1 is a sectional view showing a configuration of an optical system 1 according to the present disclosure. The optical system 1 includes a laser element 3 as a light source, and a prism 5.

The laser element 3 is, for example, a semiconductor laser. Laser light R irradiated from the laser element 3 is parallel light with different pupil diameters in X-direction as a first direction and in Y-direction as a second direction. For example, as shown in FIG. 2, laser light R immediately after irradiation from the laser element 3 has a pupil diameter $3a$ of an oval shape extending in X-direction. Laser light R irradiated from the laser element 3 is incident on an incident surface 11 of the prism 5. Laser light R has a plurality of wavelengths (wavelength ranges) so as to have colors of, for example, R(red), G(green), and B(blue). The laser element 3 may emit laser light R as one light flux in which R, G, and B lights are mixed, or may emit laser light R in sequence for each color light flux.

The prism 5 has an incident surface 11 as a first surface, a first reflection surface 13 as a second surface, and an exit surface 15 as a third surface. The first reflection surface 13 is arranged at a position on an optical path from the incident surface 11 to the exit surface 15.

Laser light R emitted from the laser element 3 is incident through the incident surface 11 into the prism 5. The incident surface 11 and the first reflection surface 13 face each other so that laser light R incident from the incident surface 11 reduces the pupil diameter $3a$ in Y-direction and is imaged at a second intermediate imaging position Py lying on the optical path between the incident surface 11 and the first reflection surface 13, after which it again increases the pupil diameter $3a$ in Y-direction, to be reflected by the first reflection surface 13 into the interior of the prism 5.

The incident surface 11 has, for example, an outward protruding convex shape. The incident surface 11 may be a rotation asymmetric surface. For example, it may be of a free curved surface shape with different curvatures in X-direction and Y-direction. By rendering the shape of the incident surface 11 convex, laser light R incident from the incident surface 11 can be refracted inward. Since laser light R can travel in the prism 5 while suppressing its spread in this manner, the prism 5 can be reduced in size. The incident surface 11 may have a refractive power in Y-direction smaller than that in X-direction. This enables suppression of chromatic aberration in Y-direction generated on the incident surface 11.

The prism 5 is made of, for example, resin or glass. The prism 5 has a refractive index n satisfying a relationship of n<1.8. This enables the influence of manufacturing error of a refraction surface of the prism 5 to be reduced. The refraction surface of the prism 5 is, for example, the incident surface 11. The prism 5 has an Abbe number vd satisfying a relationship of vd>40. This achieves reduction in chromatic aberration of light incident on the prism 5.

Laser light R incident from the incident surface 11 travels reducing the pupil diameter $3a$ in X-direction, and laser light R reflected by the first reflection surface 13 is intermediately imaged at a first intermediate imaging position Px lying on the optical path between the first reflection surface 13 and the exit surface 15, after which it again increases the pupil diameter $3a$ in X-direction, to be emitted from the exit surface 15 to the outside of the prism 5.

The first reflection surface 13 has different curvatures in X-direction and Y-direction. The first reflection surface 13 therefore has a free curved surface shape. The first reflection surface 13 may be eccentric with respect to the incident light. This enables the optical path of the incident light to be split without using an optical element such as a beam splitter.

The exit surface 15 of the prism 5 may also have a similar configuration to that of the incident surface 11. The exit surface 15 may have an outward protruding convex shape. This enables the light flux traveling in the prism 5 while suppressing the spread of laser light R to be focused outside the prism 5. The curvatures in X-direction of the incident surface 11 and the exit surface 15 may have symmetry. The exit surface 15 may have a refractive power in X-direction smaller than that in Y-direction. The exit surface 15 may be of a free curved surface shape with different curvatures in X-direction and Y-direction.

In the optical system 1 of this embodiment, the incident surface 11 of the prism 5, the first reflection surface 13 of the prism 5, and the exit surface 15 of the prism 5 are arranged in the mentioned order on the optical path from the laser element 3.

Figure 3:
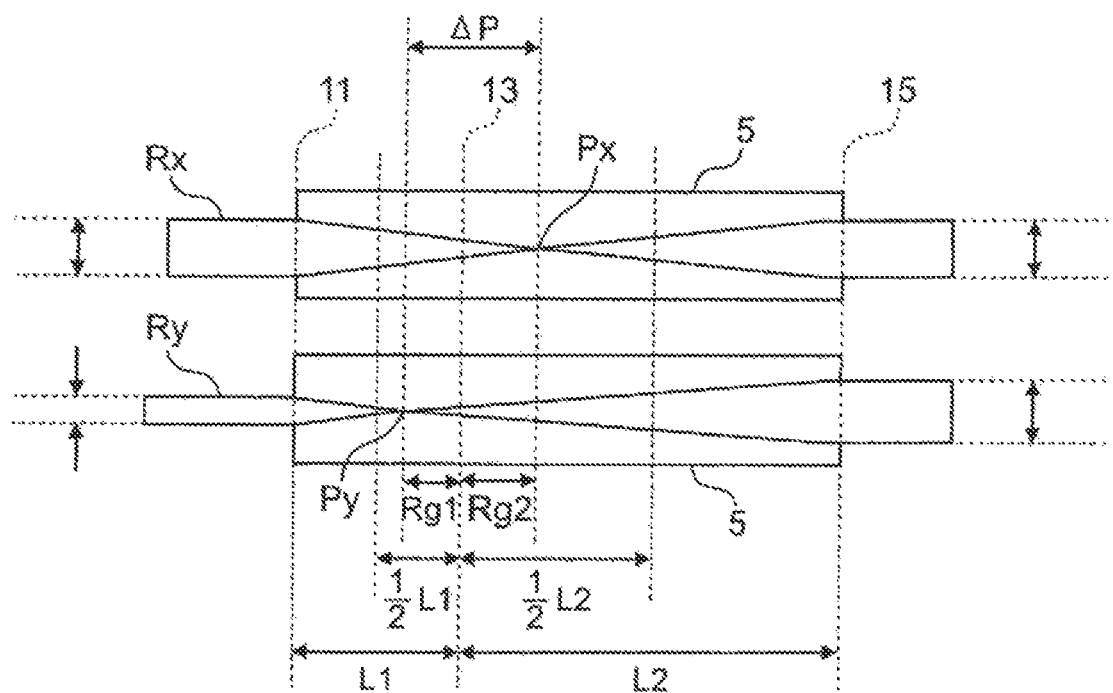
FIG. 3 is a diagram showing respective intermediate imaging positions of an X-component and a Y-component of laser light.

As shown in FIG. 3, the optical system 1 has the first intermediate imaging position Px in X-direction of the light flux of laser light R between the first reflection surface 13 of the prism 5 and the exit surface 15 of the prism 5. That is, laser light R is intermediately imaged by the incident surface 11 or the first reflection surface 13.

Since Rx as an X-direction component of laser light R and Ry as a Y-direction component have different respective focal lengths, the first intermediate imaging position Px of the X-component Rx of laser light R and the second intermediate imaging position Py of the Y-component Ry can be arranged at different positions. Due to the X-component Rx and the Y-component Ry having different respective focal lengths, respective magnifications are also different when emitted from the exit surface 15 of the prism 5. That is, the optical system 1 has optical magnifications different in X-direction and Y-direction. For example, since in this embodiment the focal length is greater in Y-direction than in X-direction, the optical magnification is greater in Y-direction than in X-direction.

For example, let Mx be the horizontal magnification in X-direction and let My be the horizontal magnification in Y-direction, a relationship of My/Mx>1.1 is satisfied. This results in an increased optical path length difference between the first intermediate imaging position Px and the second intermediate imaging position Py, allowing alleviation of the influence of scratch or dust inside the prism 5.

By satisfying a relationship of My/Mx>1.3, either the first intermediate imaging position Px or the second intermediate imaging position Py can be arranged on the optical path between the incident surface 11 and the first reflection surface 13, while either the first intermediate imaging position Px or the second intermediate imaging position Py can be arranged on the optical path between the first reflection surface 13 and the exit surface 15, allowing further alleviation of the influence of scratch or dust inside the prism 5.

By satisfying a relationship of My/Mx>1.5, the optical path length difference between the first intermediate imaging position Px and the second intermediate imaging position Py further increases, achieving further improvement in the degree of freedom of arrangement of the first intermediate imaging position Px and the second intermediate imaging position Py.

Figure 4:
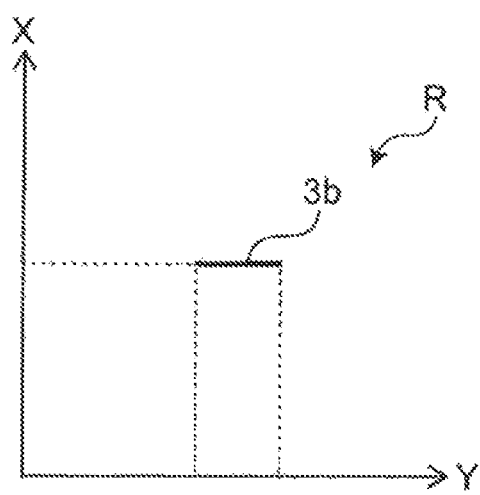
FIG. 4 is a diagram showing a pupil diameter of laser light at a first intermediate imaging position (Px).

The first intermediate imaging position Px of the light flux of laser light R in X-direction does not intersect, at the same position, the light flux of laser light R in Y-direction orthogonal to X-direction. That is, the first intermediate imaging position Px of the X-component Rx of laser light R does not lie on the same position as that of the second intermediate imaging position Py of the Y-component Ry of laser light R. Consequently, as shown in FIG. 4, a pupil diameter 3b of laser light R in an intermediate image formed at the first intermediate imaging position Px has a rectilinear shape extending in Y-direction. As a result, even if there is dust or scratch at the first intermediate imaging position Px, since the Y-component Ry of laser light R is not imaged, the pupil diameter 3b of laser light R can be prevented from disappearing.

Figure 5:
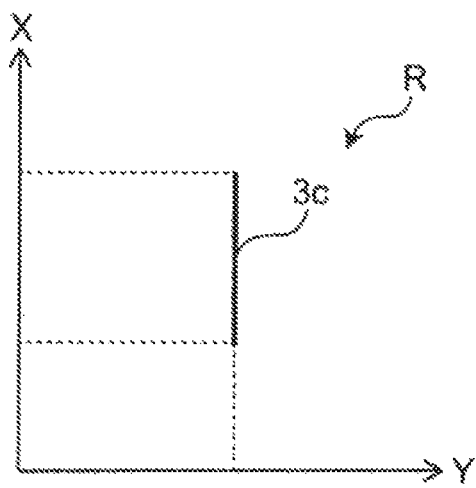
FIG. 5 is a diagram showing a pupil diameter of laser light at a second intermediate imaging position (Py).
Figure 6:
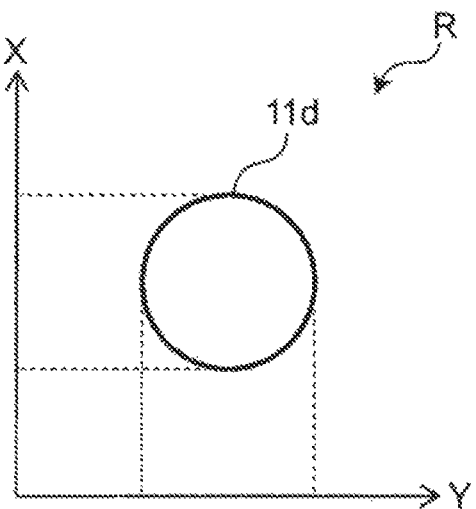
FIG. 6 is a diagram showing a pupil diameter of laser light exiting a prism.

As shown in FIG. 3, within the prism 5, the second intermediate imaging position Py of the Y-component Ry of laser light R lies, on the optical path, closer to the incident surface 11 than the first intermediate imaging position Px does where the X-component Rx of laser light R is imaged. As shown in FIG. 5, a pupil diameter 3c of laser light R in an intermediate image formed at the second intermediate imaging position Py also has a rectilinear shape extending in X-direction. As a result, even if there is dust or scratch at the second intermediate imaging position Py, since the X-component Rx of laser light R is not imaged, the pupil diameter 3c of laser light R can be prevented from disappearing. Due to the optical system 1 having a greater optical magnification in Y-direction than in X-direction, a pupil diameter 11d of laser light R emitted from the exit surface 15 is formed in a circular shape, as shown in FIG. 6. The first intermediate imaging position Px may lie, on the optical path, closer to the incident surface 11 than the second intermediate imaging position Py does.

A relationship of 0.1<(φx1×φy1)/(φx2×φy2)<0.8 is established between: a first emission pupil diameter φx1 in X-direction and a second emission pupil diameter φy1 in Y-direction of the light flux emitted from the laser element 3; and a first projection pupil diameter φx2 in X-direction and a second projection pupil diameter φy2 in Y-direction of the light flux passing through the exit surface 15 of the prism 5. By satisfying this relationship, the spot size at the intermediate imaging positions Px and Py increases, enabling effective alleviation of the influence of dust or scratch within the interior of the prism 5.

As shown in FIGS. 1 and 3, the second intermediate imaging position Py lies, toward the first reflection surface 13, within a first range Rg1 between the incident surface 11 and the first reflection surface 13. The first range Rg1 has a length less than one-half of an optical path length L1 from the incident surface 11 to the first reflection surface 13. The first range Rg1 may be of a length less than one-quarter or a length less than one-eighth of the optical path length L1 from the incident surface 11 to the first reflection surface 13. The closer the distance between the second intermediate imaging position Py and the first reflection surface 13 is, the smaller the size (footprint size) of the light flux at the first reflection surface 13 can be. The smaller the size of the light flux at the first reflection surface 13 is, the less the influence of manufacturing error of the first reflection surface 13 on the light flux can be. Accordingly, if the first range Rg1 has a length less than one-quarter, instead of less than one-half, of the optical path length L1 from the incident surface 11 to the first reflection surface 13, the influence of manufacturing error can be further reduced, and if it has a length less than one-eighth instead of less than one-quarter, the influence of manufacturing error can be even further reduced. An example of the influencing manufacturing error is, for example, a curvature error of the first reflection surface 13.

The first intermediate imaging position Px lies within a second range Rg2 from the first reflection surface 13 between the first reflection surface 13 and the exit surface 15. The second range Rg2 has a length less than one-half of an optical path length L2 from the first reflection surface 13 to the exit surface 15. The second range Rg2 may be of a length less than one-quarter or a length less than one-eighth of the optical path length L2 from the first reflection surface 13 to the exit surface 15. The closer the distance between the first intermediate imaging position Px and the first reflection surface 13 is, the smaller the size (footprint size) of the light flux at the first reflection surface 13 can be. The smaller the size of the light flux at the first reflection surface 13 is, the less the influence of manufacturing error of the first reflection surface 13 on the light flux can be. Accordingly, if the second range Rg2 has a length less than one-quarter, instead of less than one-half, of the optical path length L2 from the first reflection surface 13 to the exit surface 15, the influence of manufacturing error can be more reduced, and if it has a length less than one-eighth instead of less than one-quarter, the influence of manufacturing error can be even further reduced.

As shown in FIGS. 1 and 3, in the case that the first reflection surface 13 lies on the optical path between the first intermediate imaging position Px and the second intermediate imaging position Py, the first intermediate imaging position Px and the second intermediate imaging position Py can each be arranged closer to the first reflection surface 13. Although the reflection surface is a member having a high error sensitively, the influence of manufacturing error of the first reflection surface 13 can be more reduced by arranging the first intermediate imaging position Px and the second intermediate imaging position Py closer to the vicinity of the first reflection surface 13. The influence of dust or scratch of the prism 5 cam be more reduced by arranging the first intermediate imaging position Px and the second intermediate imaging position Py within their respective ranges different from the first reflection surface 13.

Let ΔP be the optical path length difference between the optical path length of the first intermediate imaging position Px from the incident surface 11 and the optical path length of the second intermediate imaging position Py from the incident surface 11, a relationship of

ΔP/L1>0.05 is satisfied. It is consequently possible to properly set the optical path length difference between the first intermediate imaging position Px and the second intermediate imaging position Py to alleviate the influence of scratch or dust inside the prism 5.

Although in this embodiment both the first intermediate imaging position Px and the second intermediate imaging position Py lie in the vicinity of the first reflection surface 13, at least one of the first intermediate imaging position Px and the second intermediate imaging position Py may lie in the vicinity of the first reflection surface 13. It is thus possible to decrease the size of the light flux reflected by the first reflection surface 13 to thereby reduce the influence of manufacturing error of the first reflection surface 13 on the light flux reflected by the first reflection surface 13.

Although in this embodiment the first intermediate imaging position Px lies between the first reflection surface 13 and the exit surface 15 while the second intermediate imaging position Py lies between the incident surface 11 and the first reflection surface 13, reverse arrangement is also possible. That is, the first intermediate imaging position Px may lie between the incident surface 11 and the first reflection surface 13, while the second intermediate imaging position Py may lie between the first reflection surface 13 and the exit surface 15.

Figure 7:
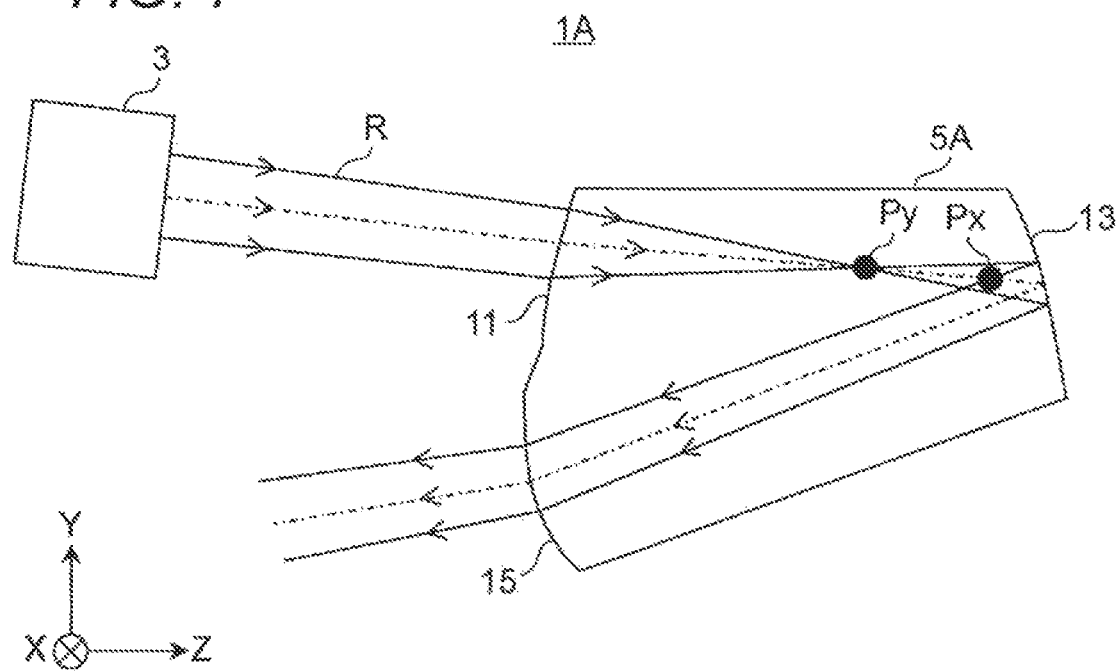
FIG. 7 is a sectional view showing a configuration of an optical system in a variant of the first embodiment.
Figure 8:
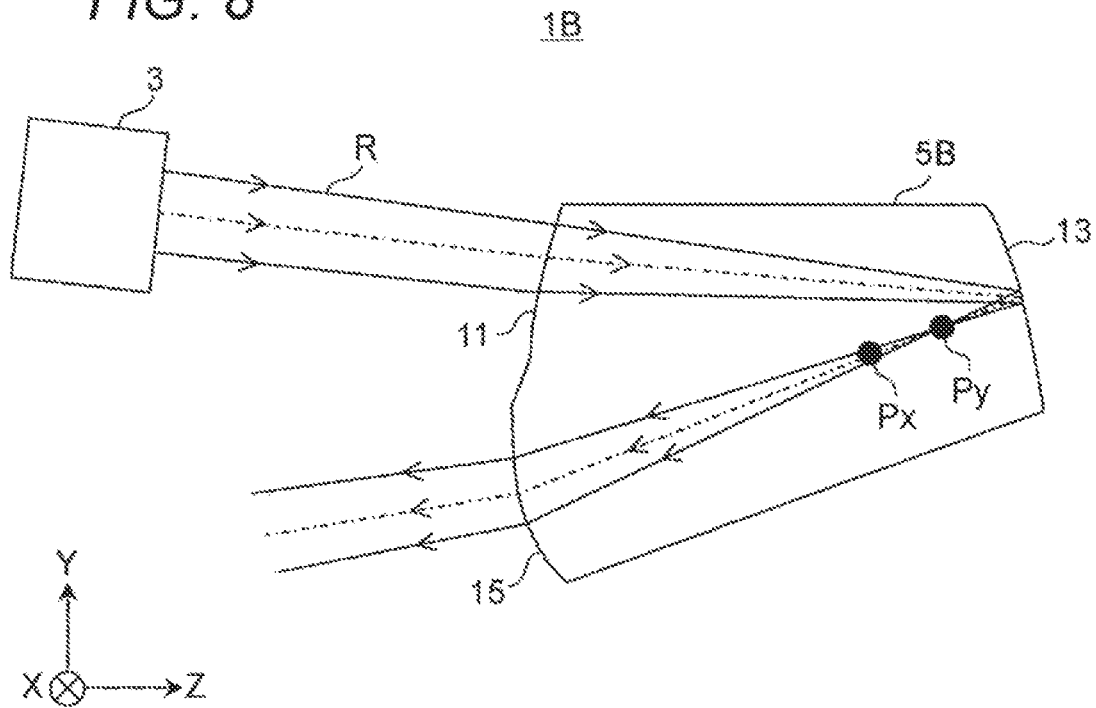
FIG. 8 is a sectional view showing a configuration of an optical system in a variant of the first embodiment.

Although in this embodiment the first intermediate imaging position Px lies between the first reflection surface 13 and the exit surface 15 while the second intermediate imaging position Py lies between the incident surface 11 and the first reflection surface 13, this is not limitative. As in an optical system 1A shown in FIG. 7, both the first intermediate imaging position Px and the second intermediate imaging position Py may lie, between the incident surface 11 and the first reflection surface 13 of a prism 5A, within the first range Rg1 from the first reflection surface 13. As in an optical system 1B shown in FIG. 8, both the first intermediate imaging position Px and the second intermediate imaging position Py may lie, between the incident surface 11 and the first reflection surface 13 of a prism 5B, within the second range Rg2 from the first reflection surface 13.

Figure 9:
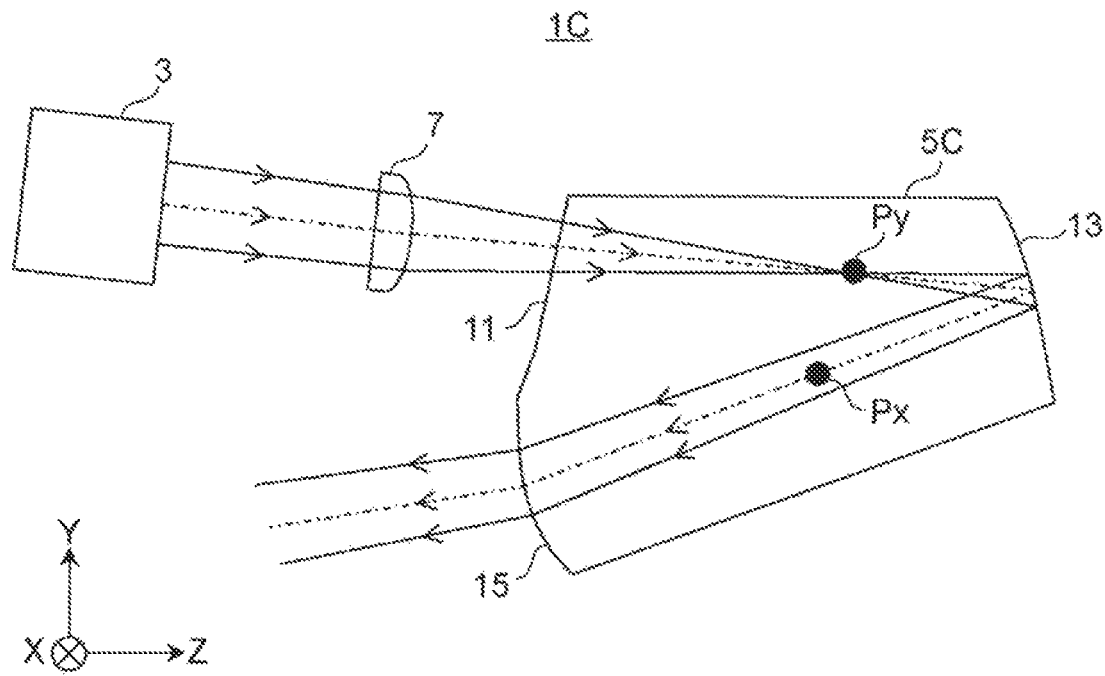
FIG. 9 is a sectional view showing a configuration of an optical system in a variant of the first embodiment.

As in an optical system 10 shown in FIG. 9, a lens element 7 having different condensing actions in X-direction and Y-direction of the light flux may be arranged between the laser element 3 and the incident surface 11 of a prism 5C. The lens element 7 is, for example, a cylindrical lens having different curvatures for X-direction and Y-direction of the light flux. The light flux exiting the lens element 7 is incident on the incident surface 11. Since the optical system 1 includes the lens element 7, the first intermediate imaging position Px and the second intermediate imaging position Py can be arranged at proper positions, achieving greater flexibility in prism design. By processing the lens element 7 rather than by processing the shape of the incident surface 11, the accuracy can be improved, facilitating the design of the intermediate imaging positions within the prism 5. The prisms 5A, 5B, and 5C have the same configuration as that of the prism 5 except for the respective points described above.

[1-2. Effects, etc.]

The optical system 1 according to the first embodiment is an optical system that includes the prism 5 having the incident surface 11 as the first surface, the first reflection surface 13 as the second surface, and the exit surface 15 as the third surface, with the light flux from the incident surface 11 being reflected by the first reflection surface 13 to head for the exit surface 15. The prism 5 has: the first intermediate imaging position Px at which the component in X-direction as the first direction of the light flux incident inside is imaged; and the second intermediate imaging position Py at which the component in Y-direction as the second direction orthogonal to the first direction of the light flux is imaged, different from the first intermediate imaging position Px. At least one of the first intermediate imaging position Px and the second intermediate imaging position Py lies within the first range Rg1 from the first reflection surface 13 between the incident surface 11 and the first reflection surface 13, or lies within the second range Rg2 from the first reflection surface 13 between the first reflection surface 13 and the exit surface 15. The first range Rg1 has the length less than one-half of the optical path length L1 from the incident surface 11 to the first reflection surface 13. The second range Rg2 has the length less than one-half of the optical path length L2 from the first reflection surface 13 to the exit surface 15.

Since the two intermediate imaging positions are formed within the prism 5 based on such a configuration, partial loss of the light flux due to scratch or dust inside the prism 5 can be reduced. Since at least one of the first intermediate imaging position Px and the second intermediate imaging position Py lies in the vicinity of the first reflection surface 13, it is possible to diminish the size (footprint size) of the light flux at the first reflection surface 13 to reduce the influence of manufacturing error of the first reflection surface 13 on the light flux.

In the case that both the first intermediate imaging position Px and the second intermediate imaging position Py lie in the vicinity of the first reflection surface 13, the size (footprint size) of the light flux at the first reflection surface 13 can be even smaller, enabling further reduction in the influence of manufacturing error of the first reflection surface 13 on the light flux.

Although in this embodiment the prism 5 has only the first reflection surface 13 as the reflection surface, it may have one or more other reflection surfaces on the optical path between the first reflection surface 13 and the exit surface 15. In this manner, the prism 5 may have at least two or more reflection surfaces.

Figure 10:
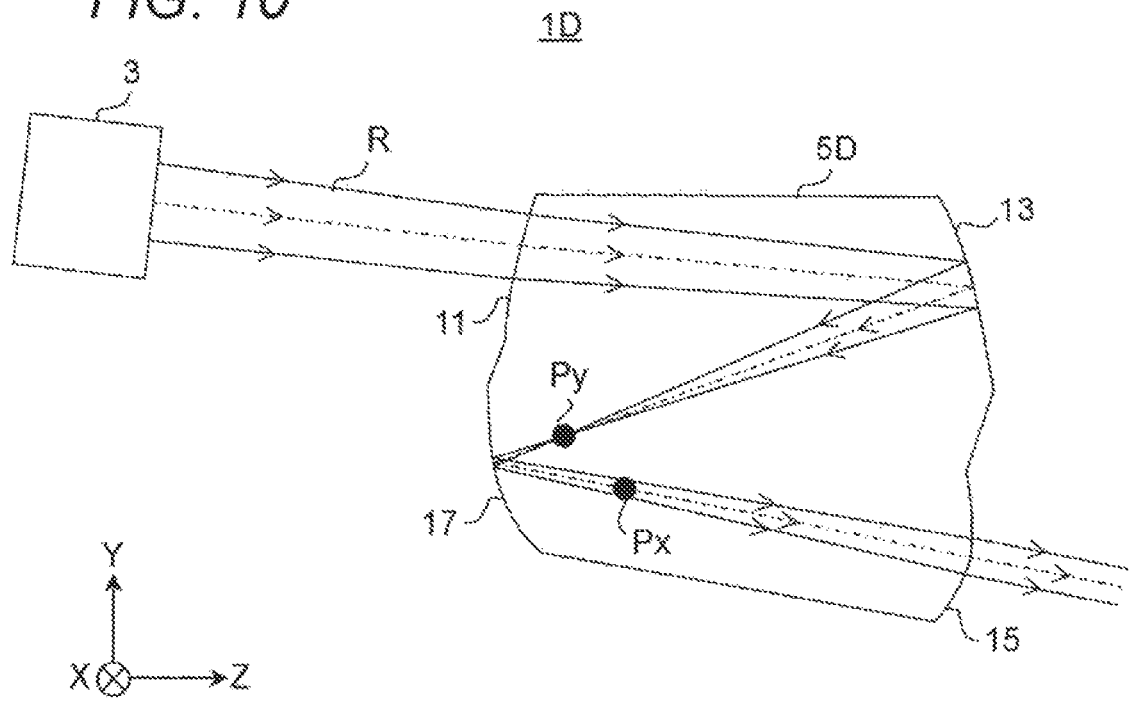
FIG. 10 is a sectional view showing a configuration of an optical system in a variant of the first embodiment.

As in an optical system 1D shown in FIG. 10, if the prism 5 has a second reflection surface 17 on the optical path between the first reflection surface 13 and the exit surface 15, then the first reflection surface 13, the second reflection surface 17, and the exit surface 15 may act as the first surface, the second surface, and the third surface, respectively. A prism 5D has the same configuration as that of the prism 5D except for this point. If the prism 5 includes three or more reflection surfaces, then the first reflection surface 13, another reflection surface, and yet another reflection surface may act as the first surface, the second surface, and the third surfaces, respectively.

Second Embodiment

Figure 11:
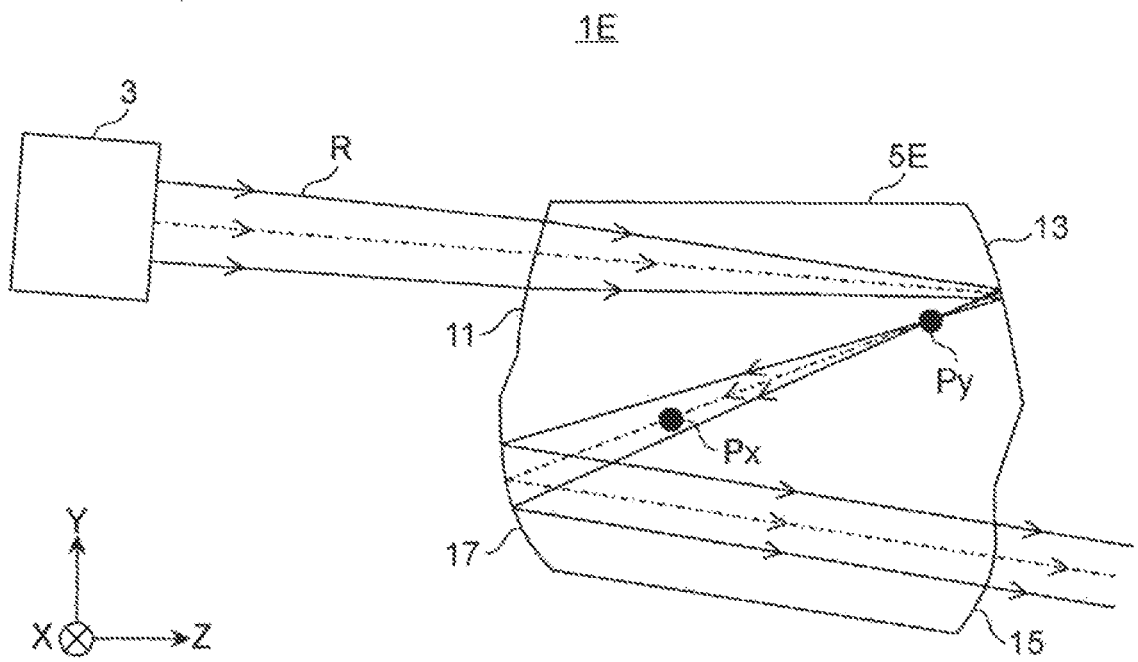
FIG. 11 is a sectional view showing a configuration of an optical system in a second embodiment.
Figure 12:
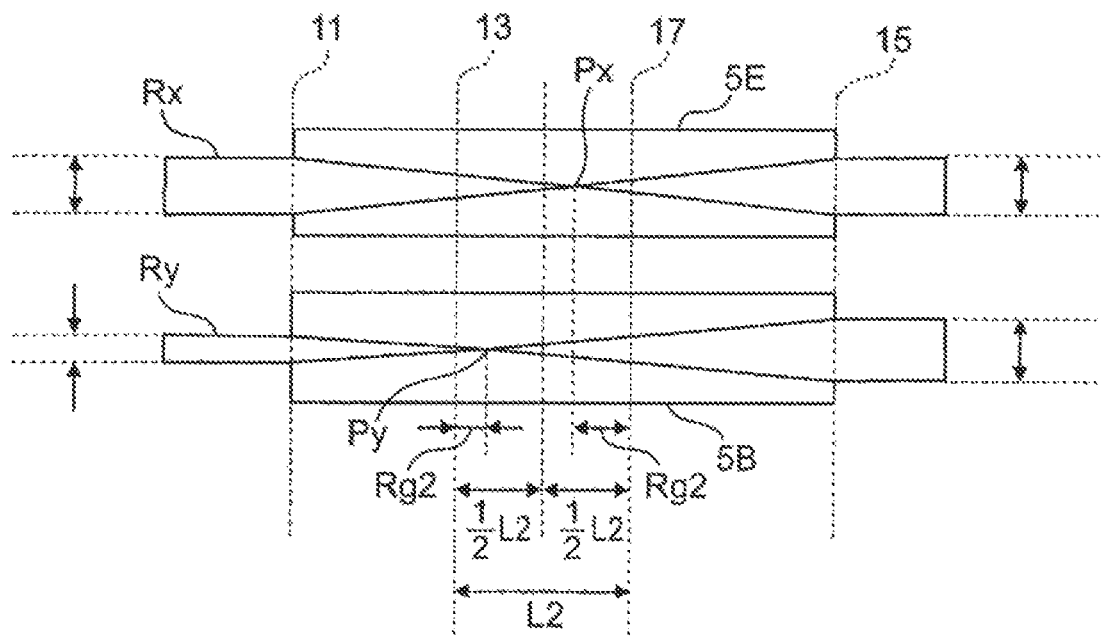
FIG. 12 is a diagram showing respective intermediate imaging positions of the X-component and Y-component of laser light.

Referring next to FIGS. 11 and 12, a second embodiment will be described. FIG. 11 is a diagram showing a configuration of an optical system 1E in the second embodiment. FIG. 12 is a diagram showing respective intermediate imaging positions of the X-component and the Y-component of laser light R.

[2-1. Configuration]

While in the prism 5 of the optical system 1 of the first embodiment, the first intermediate imaging position Px and the second intermediate imaging position Py lie in the vicinity of one reflection surface, the optical system 1E of this embodiment has the first intermediate imaging position Px or the second intermediate imaging position Py lying in the respective vicinities of the two reflection surfaces. The optical system 1 of the first embodiment is the same as the optical system 1E of this embodiment in configuration except for these different points.

A prism 5E of this embodiment includes the incident surface 11 as the first surface, the first reflection surface 13 as the second surface, the second reflection surface 17 as the third embodiment, and the exit surface 15 as a fourth surface.

The second reflection surface 17 faces each of the first reflection surface 13 and the exit surface 15. The second reflection surface 17 reflects the light flux travelling from the first reflection surface 13, toward the exit surface 15. The second reflection surface 17 may be of a free curved surface shape with different curvatures in X-direction and Y-direction.

The second intermediate imaging position Py lies within the second range Rg2 from the first reflection surface 13 between the first reflection surface 13 and the second reflection surface 17. The closer the distance between the second intermediate imaging position Py and the first reflection surface 13 is, the smaller the size (footprint size) of the light flux at the first reflection surface 13 can be. The smaller the size of the light flux at the first reflection surface 13 is, the less the influence of manufacturing error of the first reflection surface 13 on the light flux can be.

The first intermediate imaging position Px lies within the second range Rg2 from the second reflection surface 17 between the first reflection surface 13 and the second reflection surface 17. The closer the distance between the first intermediate imaging position Px and the second reflection surface 17 is, the smaller the size (footprint size) of the light flux at the second reflection surface 17 can be. The smaller the size of the light flux at the second reflection surface 17 is, the less the influence of manufacturing error of the second reflection surface 17 on the light flux can be.

By arranging each of the first intermediate imaging position Px and the second intermediate imaging position Py in the vicinity of different reflection surfaces on the optical path in this manner, the first intermediate imaging position Px and the second intermediate imaging position Py can be arranged closer to the second reflection surface 17 and the first reflection surface 13, respectively. This enables further reduction in the influence of manufacturing error of the first reflection surface 13 and the second reflection surface 17. The influence of dust or scratch of the prism 5E can be even further reduced.

Figure 13:
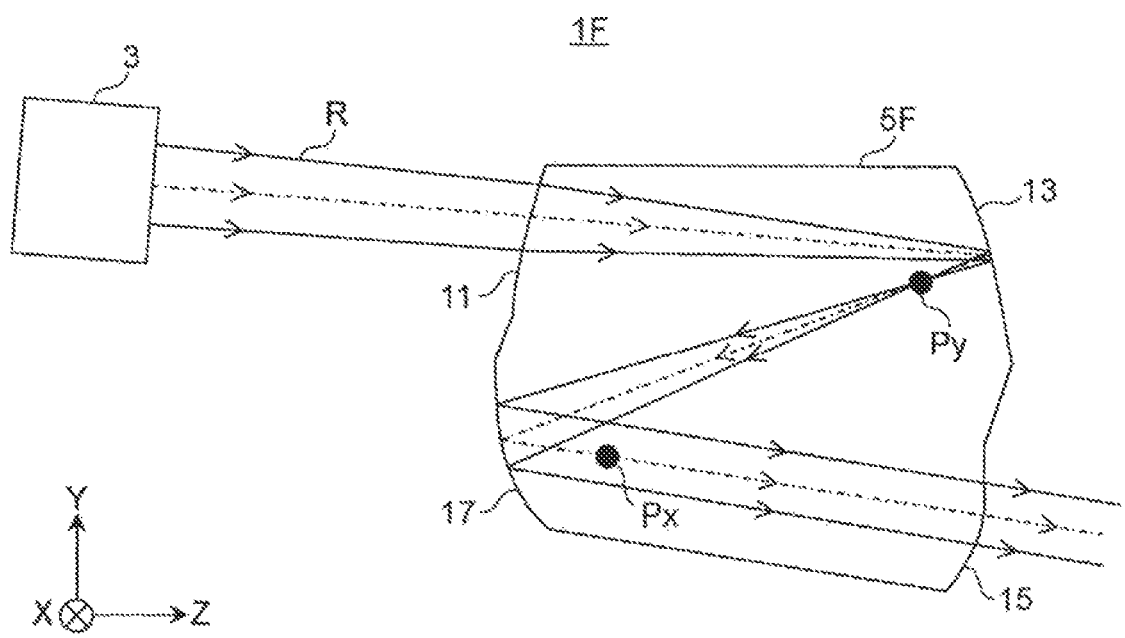
FIG. 13 is a sectional view showing a configuration of an optical system in a variant of the second embodiment.
Figure 14:
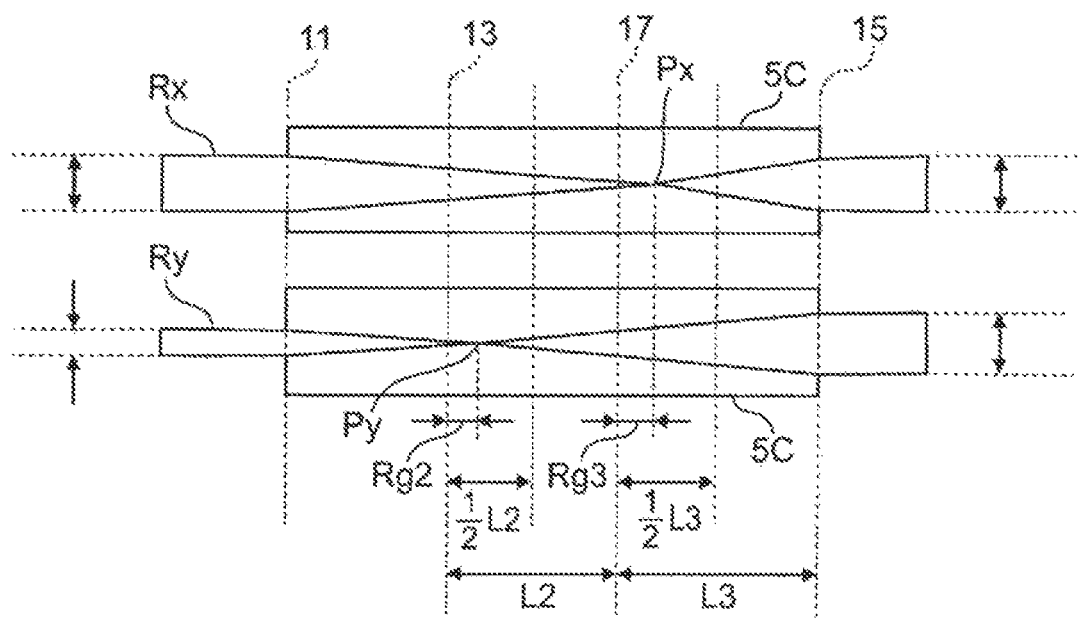
FIG. 14 is a diagram showing respective intermediate imaging positions of the X-component and Y-component of laser light.

Reference is then made to FIGS. 13 and 14. FIG. 13 is a diagram showing a configuration of an optical system 1F in a variant of the second embodiment. FIG. 14 is a diagram showing respective intermediate imaging positions of the X-component and Y-component of laser light.

The second intermediate imaging position Py lies, between the first reflection surface 13 and the second reflection surface 17 of a prism 5F, within the second range Rg2 from the first reflection surface 13. The closer the distance between the second intermediate imaging position Py and the first reflection surface 13 is, the smaller the size (footprint size) of the light flux at the first reflection surface 13 can be. The smaller the size of the light flux at the first reflection surface 13 is, the less the influence of manufacturing error of the first reflection surface 13 on the light flux can be.

The first intermediate imaging position Px lies within a third range Rg3 from the second reflection surface 17 between the second reflection surface 17 and the exit surface 15. The third range Rg3 may have a length less than one-half, less than one-quarter, or less than one-eighth of an optical path length L3 from the second reflection surface 17 to the exit surface 15. The closer the distance between the first intermediate imaging position Px and the second reflection surface 17 is, the smaller the size (footprint size) of the light flux at the second reflection surface 17 can be. The smaller the size of the light flux at the second reflection surface 17 is, the less the influence of manufacturing error of the second reflection surface 17 on the light flux can be. Accordingly, if the third range Rg3 has a length less than one-quarter, instead of less than one-half, of the optical path length L3 from the second reflection surface 17 to the exit surface 15, the influence of manufacturing error can be further reduced, and if it has a length less than one-eighth instead of less than one-quarter, the influence of manufacturing error can be even further reduced.

An additional reflection surface may be disposed on the optical path between the second reflection surface 17 and the exit surface 15. In this case, the additionally disposed reflection surface functions as the fourth surface. The prism 5F is the same as the prism 5E in configuration except for the above points.

Figure 15:
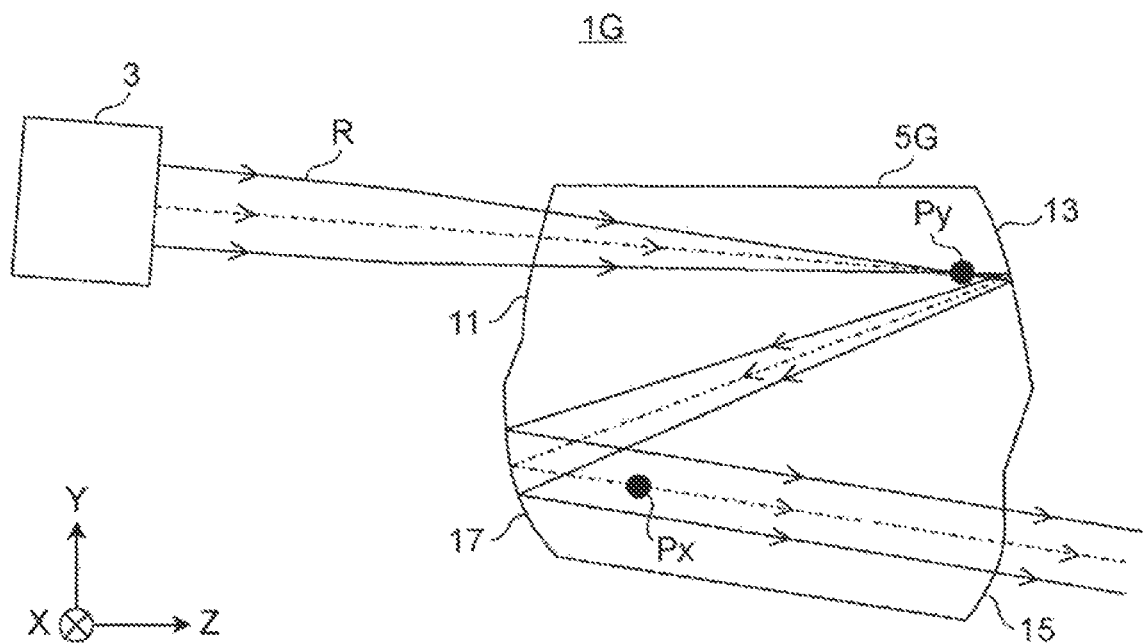
FIG. 15 is a sectional view showing a configuration of an optical system in a variant of the second embodiment.
Figure 16:
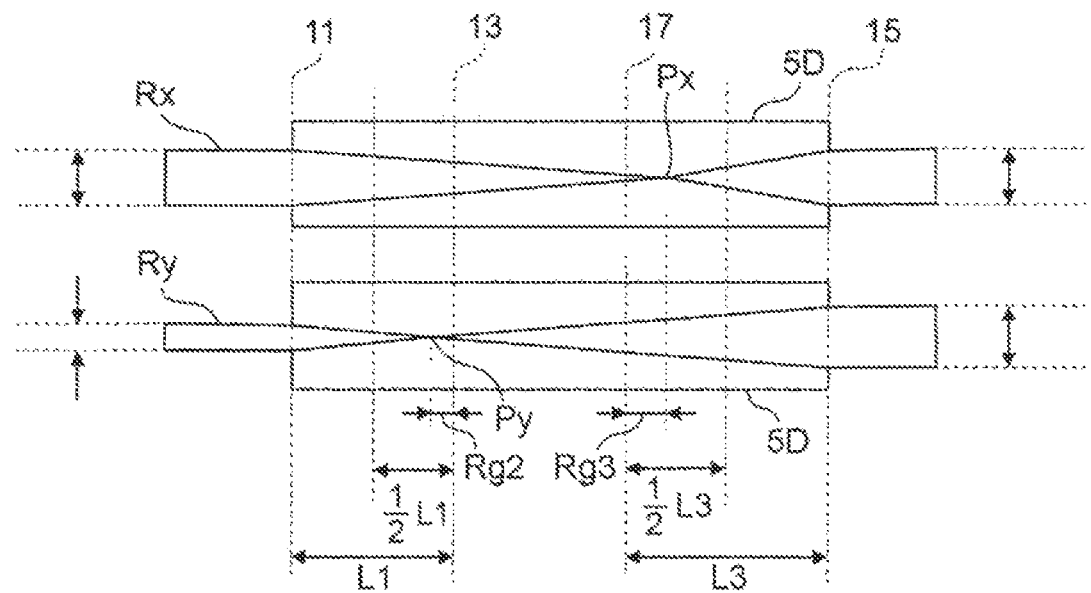
FIG. 16 is a diagram showing respective intermediate imaging positions of the X-component and Y-component of laser light.

Reference is then made to FIGS. 15 and 16. FIG. 15 is a diagram showing a configuration of an optical system 1G in a variant of the second embodiment. FIG. 16 is a diagram showing respective intermediate imaging positions of the X-component and Y-component of laser light.

The second intermediate imaging position Py lies, between the incident surface 11 and the first reflection surface 13 of a prism 5G, within the first range Rg1 from the first reflection surface 13. The closer the distance between the second intermediate imaging position Py and the first reflection surface 13 is, the smaller the size (footprint size) of the light flux at the first reflection surface 13 can be. The smaller the size of the light flux at the first reflection surface 13 is, the less the influence of manufacturing error of the first reflection surface 13 on the light flux can be.

The first intermediate imaging position Px lies within the third range Rg3 from the second reflection surface 17 between the second reflection surface 17 and the exit surface 15. The closer the distance between the first intermediate imaging position Px and the second reflection surface 17 is, the smaller the size (footprint size) of the light flux at the second reflection surface 17 can be. The smaller the size of the light flux at the second reflection surface 17 is, the less the influence of manufacturing error of the second reflection surface 17 on the light flux can be.

An additional reflection surface may be disposed on the optical path between the second reflection surface 17 and the exit surface 15. In this case, the additionally disposed reflection surface functions as the fourth surface. The prism 5G is the same as the prism 5E in configuration except for the above points. Also in the optical system 1E, the lens element 7 having different condensing actions in X-direction and Y-direction of the light flux may be arranged between the laser element 3 and the incident surface 11 of the prism 5E.

[2-2. Effects, etc.]

The optical system 1 according to the second embodiment includes the incident surface 11 as the first surface, the first reflection surface 13 as the second surface, the second reflection surface 17 as the third embodiment, and the exit surface 15 as the fourth surface. In the prism 5E, the light flux from the incident surface 11 is reflected by the first reflection surface 13 to head for the second reflection surface 17, and the light flux from the first reflection surface 13 is reflected by the second reflection surface 17 to head for the exit surface 15. The prism 5E has: the first intermediate imaging position Px at which the component in X-direction of the light flux incident inside is imaged; and the second intermediate imaging position Py at which the component in Y-direction orthogonal to X-direction of the light flux is imaged. One of the first intermediate imaging position Px and the second intermediate imaging position Py lies within the first range Rg1 from the first reflection surface 13 between the incident surface 11 and the first reflection surface 13, or lies within the second range Rg2 from the second reflection surface 17 between the first reflection surface 13 and the second reflection surface 17. The other of the first intermediate imaging position Px and the second intermediate imaging position Py lies within the second range Rg2 from the second reflection surface 17 between the first reflection surface 13 and the second reflection surface 17, or lies within the third range Rg3 from the second reflection surface 17 between the second reflection surface 17 and the exit surface 15. The second range Rg2 has the length less than one-half of the optical path length from the first reflection surface 13 to the second reflection surface 17. The third range Rg3 has the length less than one-half of the optical path length from the second reflection surface 17 to the exit surface 15.

Since the two intermediate imaging positions are formed within the prism 5E based on such a configuration, partial loss of the light flux due to scratch or dust inside the prism 5E can be reduced. Since at least one of the first intermediate imaging position Px and the second intermediate imaging position Py lies in the vicinity of the second reflection surface 17, it is possible to diminish the size (footprint size) of the light flux at the second reflection surface 17 to reduce the influence of manufacturing error of the second reflection surface 17 on the light flux.

The two intermediate imaging positions, i.e., the first intermediate imaging position Px and the second intermediate imaging position Py may lie in the respective vicinities of the two reflection surfaces, i.e., the first reflection surface 13 and the second reflection surface 17, respectively. This enables reduction in size of the light flux reflected by each of the reflection surfaces, making it possible to lessen the influence of manufacturing error of each of the reflection surfaces on the light flux.

Third Embodiment

Figure 17:
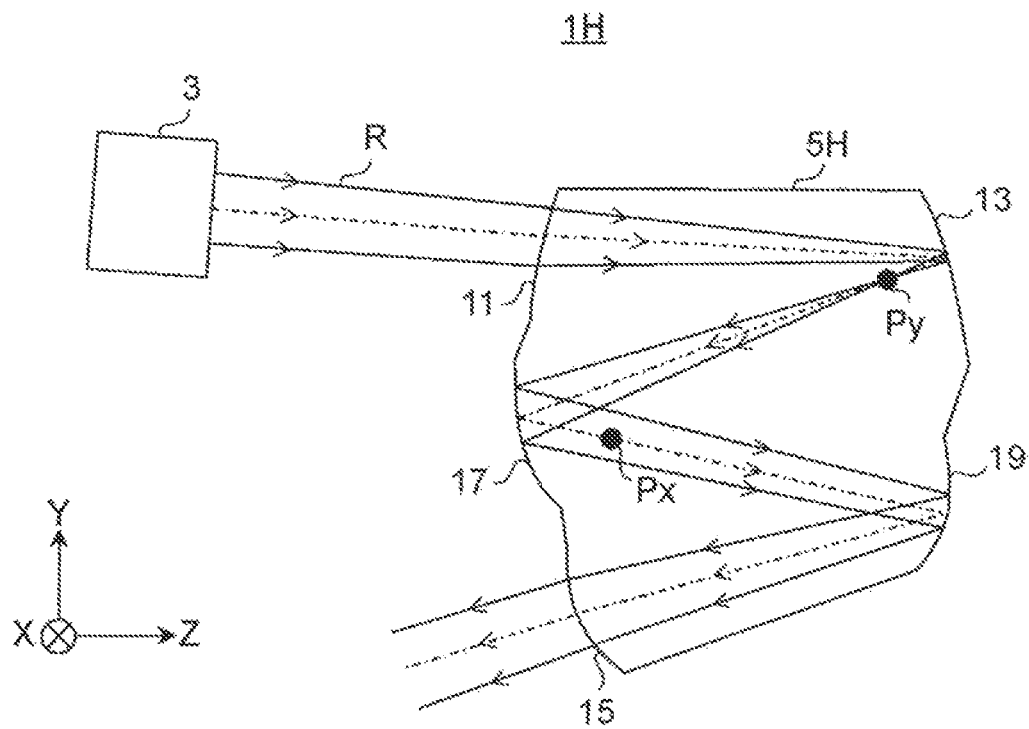
FIG. 17 is a sectional view showing a configuration of an optical system in a third embodiment.
Figure 18:
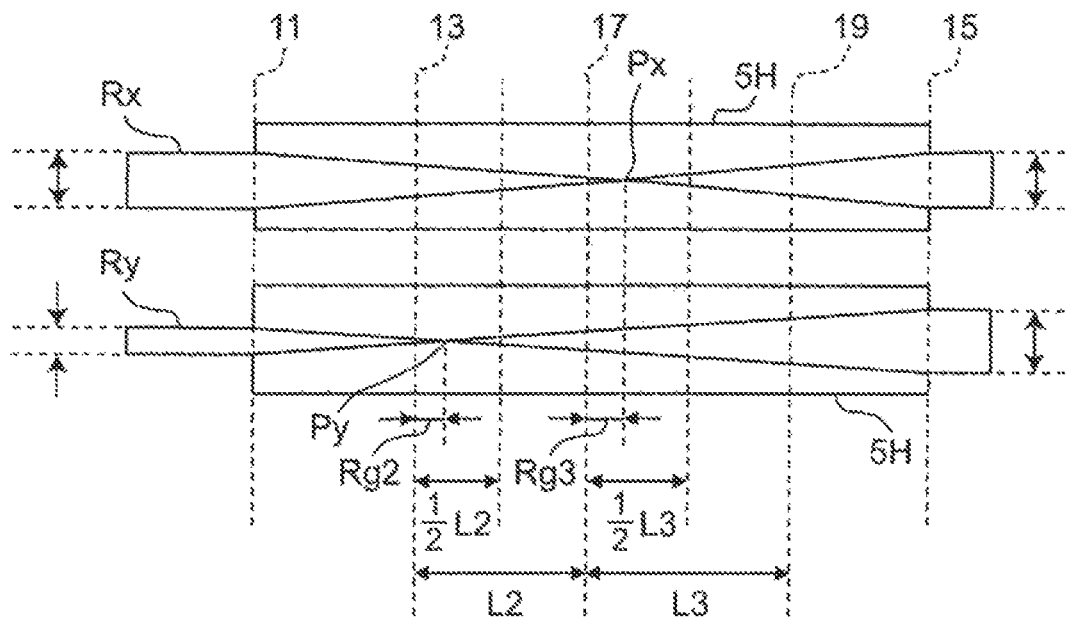
FIG. 18 is a diagram showing respective intermediate imaging positions of the X-component and Y-component of laser light.

A third embodiment will then be described with reference to FIGS. 17 and 18. FIG. 17 is a diagram showing a configuration of an optical system 1H in the third embodiment. FIG. 18 is a diagram showing respective intermediate imaging positions of the X-component and Y-component of laser light R.

[3-1. Configuration]

As shown in FIG. 17, the optical system 1H of this embodiment further includes a third reflection surface 19 in addition to the optical system 1E of the second embodiment. The optical system 1E in the second embodiment is the same as the optical system 1H of this embodiment in configuration except for points described below.

A prism 5H of this embodiment includes the incident surface 11 as the first surface, the first reflection surface 13 as the second surface, the second reflection surface 17 as the third embodiment, the third reflection surface 19 as the fourth surface, and the exit surface 15 as a fifth surface.

The third reflection surface 19 confronts each of the second reflection surface 17 and the exit surface 15. The third reflection surface 19 reflects the light flux proceeding from the second reflection surface 17, toward the exit surface 15. The third reflection surface 19 may be of a free curved surface shape with different curvatures in X-direction and Y-direction.

The first intermediate imaging position Px lies within the third range Rg3 from the second reflection surface 17 between the second reflection surface 17 and the third reflection surface 19. The closer the distance between the first intermediate imaging position Px and the second reflection surface 17 is, the smaller the size (footprint size) of the light flux at the second reflection surface 17 can be. The smaller the size of the light flux at the second reflection surface 17 is, the less the influence of manufacturing error of the second reflection surface 17 on the light flux can be.

The second intermediate imaging position Py lies within the second range Rg2 from the first reflection surface 13 between the first reflection surface 13 and the second reflection surface 17. The closer the distance between the second intermediate imaging position Py and the first reflection surface 13 is, the smaller the size (footprint size) of the light flux at the first reflection surface 13 can be. The smaller the size of the light flux at the first reflection surface 13 is, the less the influence of manufacturing error of the first reflection surface 13 on the light flux can be.

Since the two intermediate imaging positions, i.e., the first intermediate imaging position Px and the second intermediate imaging position Py lie in the respective vicinities of the first reflection surface 13 and the second reflection surface 17, respectively, it is possible to lessen the influence of manufacturing error of the first reflection surface 13 and the second reflection surface 17 on the reflected light flux. Accordingly, only the third reflection surface 19 may be intensively managed in manufacture, making it possible to reduce the number of reflection surfaces to be intensively managed, to thereby reduce labor in manufacturing. The second intermediate imaging position Py and the first intermediate imaging position Px are arranged at positions posterior to reflection at the first reflection surface 13 and the second reflection surface 17, respectively. By doing so, the second intermediate imaging position Py and the first intermediate imaging position Px are brought closer the third reflection surface 19 as much as possible, diminishing the size (footprint size) of the light flux at the third reflection surface 19. Also in the optical system 1H, the lens element 7 having different condensing actions in X-direction and Y-direction of the light flux may be arranged between the laser element 3 and the incident surface 11 of the prism 5H.

[3-2. Effects, etc.]

The optical system 1H according to the third embodiment includes the incident surface 11 as the first surface, the first reflection surface 13 as the second surface, the second reflection surface 17 as the third embodiment, the third reflection surface 19 as the fourth surface, and the exit surface 15 as the fifth surface. In the prism 5H: the light flux from the incident surface 11 is reflected by the first reflection surface 13 to head for the second reflection surface 17; the light flux from the first reflection surface 13 is reflected by the second reflection surface 17 to head for the third reflection surface 19; and the light flux from the second reflection surface 17 is reflected by the third reflection surface 19 to head for the exit surface 15. The prism 5E has: the first intermediate imaging position Px at which the component in X-direction of the light flux incident inside is imaged; and the second intermediate imaging position Py at which the component in Y-direction orthogonal to X-direction of the light flux is imaged. The first intermediate imaging position Px lies within the third range Rg3 from the second reflection surface 17 between the second reflection surface 17 and the third reflection surface 19. The third range Rg3 has the length less than one-half of the optical path length from the second reflection surface 17 to the third reflection surface 19. The second intermediate imaging position Py lies within the second range Rg2 from the first reflection surface 13 between the first reflection surface 13 and the second reflection surface 17.

Since the two intermediate imaging positions, i.e., the first intermediate imaging position Px and the second intermediate imaging position Py are formed within the prism 5H based on such a configuration, partial loss of the light flux due to scratch or dust inside the prism 5H can be reduced. Since the first intermediate imaging position Px is arranged in the vicinity of the second reflection surface 17 while the second intermediate imaging position Py is arranged in the vicinity of the first reflection surface 13, it is possible to diminish the size (footprint size) of the light flux at each of the first reflection surface 13 and the second reflection surface 17 to reduce the influence of manufacturing error of the first reflection surface 13 and the second reflection surface 17 on the light flux.

Other Embodiments

As above, the first to third embodiments have been described as exemplifications of the techniques disclosed in the present application. However, the techniques in the present disclosure are not limited thereto, and are applicable to any embodiments undergoing alterations, permutations, additions, omissions, etc. It is also possible to combine the constituent elements described in the first to third embodiment, into a new embodiment.

Although the exit surfaces 15 of the prisms 5 to 5H are convex in the first to third embodiments, this is not limitative. The exit surfaces 15 of the prisms 5 to 5H may not be convex, for example, may be planar.

Figure 19:
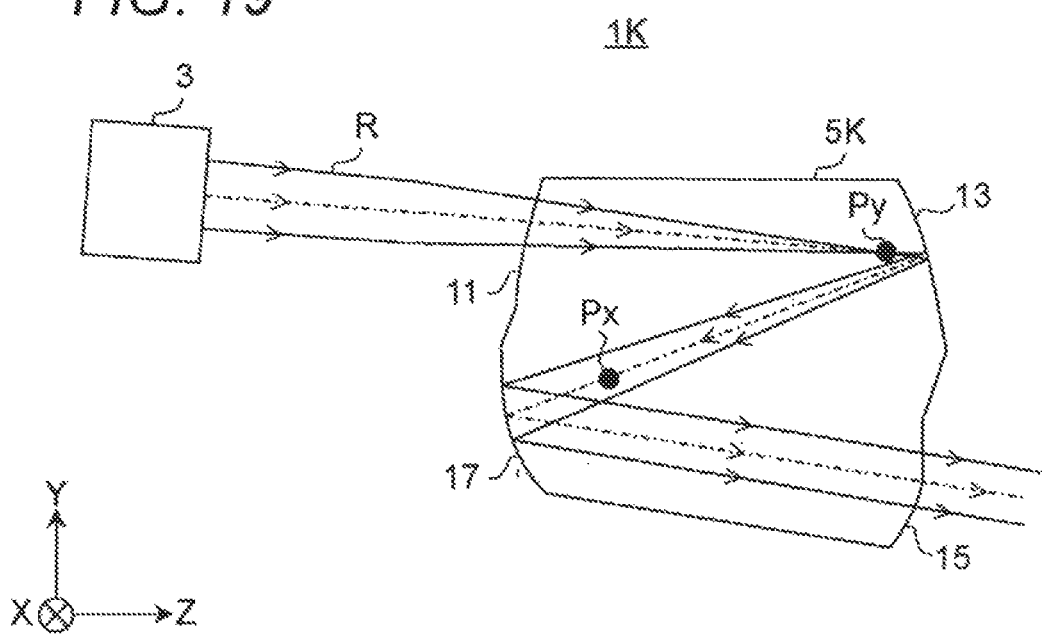
FIG. 19 is a sectional view showing a configuration of an optical system in a variant of the second embodiment.

Although in the variant of the second embodiment shown in FIG. 15, the first intermediate imaging position Px lies within the third range Rg3 from the second reflection surface 17 between the second reflection surface 17 and the exit surface 15, this is not limitative. As shown in FIG. 19, in an optical system 1K, the first intermediate imaging position Px may lie, between the first reflection surface 13 and the second reflection surface 17 of a prism 5K, within the second range Rg2 from the second reflection surface 17. The closer the distance between the first intermediate imaging position Px and the second reflection surface 17 is, the smaller the size (footprint size) of the light flux at the second reflection surface 17 can be. The smaller the size of the light flux at the second reflection surface 17 is, the less the influence of manufacturing error of the second reflection surface 17 on the light flux can be.

As above, the embodiments have been described as exemplifications of the techniques in the present disclosure. To that end, the accompanying drawings and detailed description have been provided. Accordingly, the constituent elements described in the accompanying drawings and detailed description may include not only constituent elements essential for solving the problems but also constituent elements, not essential for problem solving, for exemplifying the above techniques. Hence, those inessential constituent elements should not be recognized as being essential immediately from the fact that those inessential constituent elements are described in the accompanying drawings or detailed description.

Since the above embodiments are intended to exemplify the techniques in the present disclosure, it is possible in claims or their equivalences to make various alterations, permutations, additions, omissions, etc.

SUMMARY OF THE EMBODIMENTS (1) The optical system of the present disclosure is an optical system including a prism that has the first surface, the second surface, and the third surface, with the light flux from the first surface being reflected by the second surface to head for the third surface. The prism has: the first intermediate imaging position at which the component in the first direction of the light flux incident inside is imaged; and the second intermediate imaging position at which the component in the second direction orthogonal to the first direction of the light flux is imaged, different from the first intermediate imaging position. At least one of the first intermediate imaging position and the second intermediate imaging position lies within the first range from the second surface between the first surface and the second surface, or lies within the second range from the second surface between the second surface and the third surface. The first range has the length less than one-half of the optical path length from the first surface to the second surface, and the second range has the length less than one-half of the optical path length from the second surface to the third surface.

Due to two positions at each of which the light flux is intermediately imaged within the prism, the influence of scratch in the prism can be dispersed. Due to arrangement of either the first intermediate imaging position or the second intermediate imaging position in the vicinity of the second surface, the size of the light flux reflected by the second surface can be diminished to lessen the influence of manufacturing error of the second surface on the light flux.

(2) In the optical system of (1), one of the first intermediate imaging position and the second intermediate imaging position lies within the first range from the second surface between the first surface and the second surface, while the other of the first intermediate imaging position and the second intermediate imaging position lies within the second range from the second surface between the second surface and the third surface.

As a result, one of the first intermediate imaging position and the second intermediate imaging position lies on the optical path toward the first surface from the second surface, while the other of the first intermediate imaging position and the second intermediate imaging position lies on the optical path toward the third surface from the second surface, allowing both the first intermediate imaging position and the second intermediate imaging position to come closer to the vicinity of the second surface. This enables further reduction in size of the light flux reflected by the second surface, to further lessen the influence of manufacturing error of the second surface on the light flux. By arranging the first intermediate imaging position and the second intermediate imaging position within different respective ranges from the second surface, the influence of dust or scratch in the prism can be further reduced.

(3) In the optical system of (1), both the first intermediate imaging position and the second intermediate imaging position lie within the first range from the second surface between the first surface and the second surface, or lie within the second range from the second surface between the second surface and the third surface.

This allows both the first intermediate imaging position and the second intermediate imaging position to lie in the vicinity of the second surface, enabling the size of the light flux reflected by the second surface to be even smaller, to further reduce the influence of manufacturing error of the second surface on the light flux.

(4) In the optical system of any one of (1) to (3), the first range has the length less than one-quarter of the optical path length from the first surface to the second surface, while the second range has the length less than one-quarter of the optical path length from the second surface to the third surface.

Since the intermediate imaging positions lie even closer to the second surface, the size of the light flux reflected by the second surface can be further diminished, achieving further reduction in influence of manufacturing error of the second surface on the light flux.

(5) In the optical system of any one of (1) to (3), the first range has the length less than one-eighth of the optical path length from the first surface to the second surface, while the second range has the length less than one-eighth of the optical path length from the second surface to the third surface.

Since the intermediate imaging positions lie yet even closer to the second surface, the size of the light flux reflected by the second surface can be even further diminished, achieving still further reduction in influence of manufacturing error of the second surface on the light flux.

(6) In the optical system of any one of (1) to (5), the first surface is the incident surface.

(7) The optical system of (6) includes the lens element having different condensing actions in the first direction and the second direction, with the light flux leaving the lens element being incident on the incident surface. This facilitates design of the intermediate imaging positions within the prism.

(8) In the optical system of any one of (1) to (7), at least one of the first surface, the second surface, and the third surface has a free curved surface shape.

(9) The optical system of the present disclosure is an optical system that includes the prism having the first surface, the second surface, the third surface, and the fourth surface, with the light flux from the first surface being reflected by the second surface to head for the third surface, the light flux from the second surface being reflected by the third surface to head for the fourth surface. The prism has: the first intermediate imaging position at which the component in the first direction of the light flux incident inside is imaged; and the second intermediate imaging position at which the component in the second direction orthogonal to the first direction of the light flux is imaged, different from the first intermediate imaging position. One of the first intermediate imaging position and the second intermediate imaging position lies within the first range from the second surface between the first surface and the second surface, or lies within the second range from the second surface between the second surface and the third surface. The other of the first intermediate imaging position and the second intermediate imaging position lies within the second range from the third surface between the second surface and the third surface, or lies within the third range from the third surface between the third surface and the fourth surface. The first range has the length less than one-half of the optical path length from the first surface to the second surface. The second range has the length less than one-half of the optical path length from the second surface to the third surface. The third range has the length less than one-half of the optical path length from the third surface to the fourth surface.

(10) In the optical system of (9), one of the first intermediate imaging position and the second intermediate imaging position lies within the second range from the second surface between the second surface and the third surface, while the other of the first intermediate imaging position and the second intermediate imaging position lies within the third range from the third surface between the third surface and the fourth surface. This makes it possible to arrange one of the first intermediate imaging position and the second intermediate imaging position in the vicinity of the second surface and to arrange the other of the first intermediate imaging position and the second intermediate imaging position in the vicinity of the third surface. By arranging the two intermediate imaging positions in the respective vicinities of the different surfaces, the influence of manufacturing error of each of the surfaces can be further reduced. The influence of dust or scratch in the prism can also be further reduced.

(11) In the optical system of (9), one of the first intermediate imaging position and the second intermediate imaging position lies within the first range from the second surface between the first surface and the second surface, while the other of the first intermediate imaging position and the second intermediate imaging position lies within the third range from the third surface between the third surface and the fourth surface. This makes it possible to arrange one of the first intermediate imaging position and the second intermediate imaging position in the vicinity of the second surface and to arrange the other of the first intermediate imaging position and the second intermediate imaging position in the vicinity of the third surface. By arranging the two intermediate imaging positions in the respective vicinities of the different surfaces, the influence of manufacturing error of each of the surfaces can be further reduced. The influence of dust or scratch in the prism can also be further reduced.

(12) In the optical system of (9), one of the first intermediate imaging position and the second intermediate imaging position lies within the first range from the second surface between the first surface and the second surface, while the other of the first intermediate imaging position and the second intermediate imaging position lies within the second range from the third surface between the second surface and third surface. This makes it possible to arrange one of the first intermediate imaging position and the second intermediate imaging position in the vicinity of the second surface and to arrange the other of the first intermediate imaging position and the second intermediate imaging position in the vicinity of the third surface. By arranging the two intermediate imaging positions in the respective vicinities of the different surfaces, the influence of manufacturing error of each of the surfaces can be further reduced. The influence of dust or scratch in the prism can also be further reduced.

(13) In the optical system of (9), one of the first intermediate imaging position and the second intermediate imaging position lies within the second range from the second surface between the second surface and the third surface, while the other of the first intermediate imaging position and the second intermediate imaging position lies within the second range from the third surface between the second surface and third surface. This makes it possible to arrange one of the first intermediate imaging position and the second intermediate imaging position in the vicinity of the second surface and to arrange the other of the first intermediate imaging position and the second intermediate imaging position in the vicinity of the third surface. By arranging the two intermediate imaging positions in the respective vicinities of the different surfaces, the influence of manufacturing error of each of the surfaces can be further reduced. The influence of dust or scratch in the prism can also be further reduced.

(14) In the optical system of (9): the first range has the length less than one-quarter of the optical path length from the first surface to the second surface; the second range has the length less than one-quarter of the optical path length from the second surface to the third surface; and the third range has the length less than one-quarter of the optical path length from the third surface to the fourth surface.

(15) In the optical system of (9): the first range has the length less than one-eighth of the optical path length from the first surface to the second surface; the second range has the length less than one-eighth of the optical path length from the second surface to the third surface; and the third range has the length less than one-eighth of the optical path length from the third surface to the fourth surface.

(16) In the optical system of any one of (9) to (15), the first surface is the incident surface.

(17) The optical system of (16) includes the lens element having different condensing actions in the first direction and the second direction, with the light flux leaving the lens element being incident on the incident surface. This facilitates design of the intermediate imaging positions within the prism.

(18) In the optical system of any one of (9) to (17), at least one of the first surface, the second surface, the third surface, and the fourth surface has a free curved surface shape.

(19) In the optical system of any one of (1) to (18), the refractive index n of the prism satisfies the relationship of n<1.8. This enables the influence of manufacturing error of the refraction surface of the prism to be reduced.

(20) In the optical system of any one of (1) to (19), the Abbe number vd of the prism satisfies the relationship of vd>40. This achieves reduction in chromatic aberration of the prism.

(21) In the optical system of any one of (1) to (20), let Mx be the horizontal magnification in the first direction and let My be the horizontal magnification in the second direction, the relationship of My/Mx>1.1 is satisfied. This results in an increased optical path length difference between the first intermediate imaging position and the second intermediate imaging position, allowing alleviation of the influence of scratch or dust inside the prism.

(22) In the optical system of any one of (1) to (21), let ΔP be the optical path length difference between the first intermediate imaging position and the second intermediate imaging position and let L be the optical path length from the first surface to the second surface, the relationship of ΔP/L>0.05 is satisfied. It is consequently possible to properly set the optical path length difference between the first intermediate imaging position and the second intermediate imaging position to alleviate the influence of scratch or dust inside the prism.

(23) The optical system of any one of (1) to (22) further includes the laser element irradiating laser light onto the incident surface of the prism, with the first direction being the major axis direction of the pupil diameter of laser light emitted from the laser element, the second direction being the minor axis direction of the pupil diameter of laser light emitted from the laser element, the first direction and the second direction being orthogonal to each other, the second intermediate imaging position lying closer to the incident surface than the first intermediate imaging position does.

The present disclosure is applicable to an optical system that uses a dioptric system such as a prism.

EXPLANATIONS OF LETTERS OR NUMERALS 1, 1A, 1B, 1C, 1D, 1E, 1F, 1G, 1H, 1K optical system
3 laser element
3a, 3b pupil diameter
5, 5A, 5B, 5C, 5D, 5E, 5F, 5G, 5H, 5K prism
11 incident surface
13 first reflection surface
15 exit surface
17 second reflection surface
19 third reflection surface
L1, L2, L3 optical path length
Px first intermediate imaging position
Py second intermediate imaging position
R laser light

What is claimed is:
1. An optical system comprising a prism that includes a first surface, a second surface, and a third surface, with a light flux from the first surface being reflected by the second surface to head for the third surface,
the prism having:
a first intermediate imaging position at which a component in a first direction of the light flux incident inside is imaged; and
a second intermediate imaging position at which a component in a second direction orthogonal to the first direction of the light flux is imaged, different from the first intermediate imaging position,
at least one of the first intermediate imaging position and the second intermediate imaging position lying within a first range from the second surface between the first surface and the second surface or lying within a second range from the second surface between the second surface and the third surface,
the first range having a length less than one-half of an optical path length from the first surface to the second surface,
the second range having a length less than one-half of the optical path length from the second surface to the third surface.

2. The optical system of claim 1, wherein
one of the first intermediate imaging position and the second intermediate imaging position lies within the first range from the second surface between the first surface and the second surface, while the other of the first intermediate imaging position and the second intermediate imaging position lies within the second range from the second surface between the second surface and the third surface.

3. The optical system of claim 1, wherein
both of the first intermediate imaging position and the second intermediate imaging position lie within the first range from the second surface between the first surface and the second surface or lie within the second range from the second surface between the second surface and the third surface.

4. The optical system of claim 1, wherein
the first range has a length less than one-quarter of the optical path length from the first surface to the second surface, and wherein
the second range has a length less than one-quarter of the optical path length from the second surface to the third surface.

5. The optical system claim 1, wherein
the first range has a length less than one-eighth of the optical path length from the first surface to the second surface, and wherein
the second range has a length less than one-eighth of the optical path length from the second surface to the third surface.

6. The optical system claim 1, wherein
the first surface is an incident surface.

7. The optical system of claim 6, comprising a lens element that has different condensing actions in the first direction and the second direction, wherein
the light flux leaving the lens element is incident on the incident surface.

8. The optical system of claim 1,
at least one of the first surface, the second surface, and the third surface has a free curved surface shape.

9. The optical system of claim 1, wherein
the prism has a refractive index n satisfying a relationship of n<1.8.

10. The optical system of claim 1, wherein
the prism has an Abbe number vd satisfying a relationship of vd>40.

11. The optical system of claim 1,
let Mx be a horizontal magnification in the first direction and let My be a horizontal magnification in the second direction,
a relationship of
My/Mx>1.1
is satisfied.

12. The optical system of claim 1,
let ΔP be an optical path length difference between an optical path length from the first surface to the first intermediate imaging position and an optical path length from the first surface to the second intermediate imaging position and let L be the optical path length from the first surface to the second surface,
a relationship of
ΔP/L>0.05
is satisfied.

13. The optical system of claim 1, further comprising
a laser element irradiating laser light onto an incident surface of the prism, wherein
the first direction is a major axis direction of a pupil diameter of laser light emitted from the laser element, while the second direction is a minor axis direction of the pupil diameter of the laser light emitted from the laser element, the first direction and the second direction being orthogonal to each other, and wherein
the second intermediate imaging position lies closer to the incident surface than the first intermediate imaging position does.

14. An optical system comprising a prism that includes a first surface, a second surface, a third surface, and a fourth surface, with a light flux from the first surface being reflected by the second surface to head for the third surface, the light flux from the second surface being reflected by the third surface to head for the fourth surface,
the prism having:
a first intermediate imaging position at which a component in a first direction of the light flux incident inside is imaged; and
a second intermediate imaging position at which a component in a second direction orthogonal to the first direction of the light flux is imaged, different from the first intermediate imaging position,
one of the first intermediate imaging position and the second intermediate imaging position lying within a first range from the second surface between the first surface and the second surface or lying within a second range from the second surface between the second surface and the third surface,
the other of the first intermediate imaging position and the second intermediate imaging position lying within the second range from the third surface between the second surface and the third surface or lying within a third range from the third surface between the third surface and the fourth surface,
the first range having a length less than one-half of an optical path length from the first surface to the second surface,
the second range having a length less than one-half of the optical path length from the second surface to the third surface,
the third range having a length less than one-half of the optical path length from the third surface to the fourth surface.

15. The optical system of claim 14, wherein
one of the first intermediate imaging position and the second intermediate imaging position lies within the second range from the second surface between the second surface and the third surface, and wherein
the other of the first intermediate imaging position and the second intermediate imaging position lies within the third range from the third surface between the third surface and the fourth surface.

16. The optical system of claim 14, wherein
one of the first intermediate imaging position and the second intermediate imaging position lies within the first range from the second surface between the first surface and the second surface, and wherein
the other of the first intermediate imaging position and the second intermediate imaging position lies within the third range from the third surface between the third surface and the fourth surface.

17. The optical system of claim 14, wherein
one of the first intermediate imaging position and the second intermediate imaging position lies within the first range from the second surface between the first surface and the second surface, and wherein
the other of the first intermediate imaging position and the second intermediate imaging position lies within the second range from the third surface between the second surface and third surface.

18. The optical system of claim 14, wherein
one of the first intermediate imaging position and the second intermediate imaging position lies within the second range from the second surface between the second surface and the third surface, and wherein the other of the first intermediate imaging position and the second intermediate imaging position lies within the second range from the third surface between the second surface and third surface.

\* \* \* \* \*